United States Patent
Saito et al.

(10) Patent No.: US 9,076,794 B2
(45) Date of Patent: Jul. 7, 2015

(54) SEMICONDUCTOR DEVICE USING CARBON NANOTUBE, AND MANUFACTURING METHOD THEREOF

(71) Applicant: KABUSHIKI KAISHA TOSHIBA, Tokyo (JP)

(72) Inventors: Tatsuro Saito, Yokkaichi (JP); Makoto Wada, Yokkaichi (JP); Atsunobu Isobayashi, Yokkaichi (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 63 days.

(21) Appl. No.: 13/958,155

(22) Filed: Aug. 2, 2013

(65) Prior Publication Data

US 2014/0252615 A1 Sep. 11, 2014

(30) Foreign Application Priority Data

Mar. 8, 2013 (JP) ................................. 2013-046523

(51) Int. Cl.
| | |
|---|---|
| *H01L 29/40* | (2006.01) |
| *H01L 21/44* | (2006.01) |
| *H01L 23/532* | (2006.01) |
| *H01L 21/768* | (2006.01) |
| *H01L 23/522* | (2006.01) |

(52) U.S. Cl.
CPC .... *H01L 23/53276* (2013.01); *H01L 21/76879* (2013.01); *H01L 23/5226* (2013.01); *H01L 2924/0002* (2013.01)

(58) Field of Classification Search
CPC ..................... H01L 23/53276; H01L 23/5226; H01L 21/76879; H01L 2924/002; H01L 2924/00

USPC ............................. 257/741; 438/610; 977/742
See application file for complete search history.

(56) References Cited

U.S. PATENT DOCUMENTS

| | | | |
|---|---|---|---|
| 2003/0179559 A1* | 9/2003 | Engelhardt et al. ........... | 361/780 |
| 2009/0266590 A1* | 10/2009 | Aoi ................................ | 174/257 |
| 2009/0272565 A1* | 11/2009 | Gosset et al. ................. | 174/257 |
| 2010/0264544 A1* | 10/2010 | Heo et al. ...................... | 257/768 |
| 2011/0233779 A1 | 9/2011 | Wada et al. | |
| 2012/0049370 A1 | 3/2012 | Wada et al. | |
| 2012/0135598 A1* | 5/2012 | Wu et al. ....................... | 438/610 |

FOREIGN PATENT DOCUMENTS

| | | |
|---|---|---|
| JP | 2010-006696 A | 1/2010 |
| JP | 2010-135631 A | 6/2010 |
| JP | 2010-186858 A | 8/2010 |
| JP | 2011-082360 A | 4/2011 |

\* cited by examiner

*Primary Examiner* — Julio J. Maldonado
*Assistant Examiner* — Moazzam Hossain
(74) *Attorney, Agent, or Firm* — Holtz, Holtz, Goodman & Chick PC

(57) ABSTRACT

According to one embodiment, a semiconductor device includes a wiring, a first insulation film, an underlayer deactivation layer, an underlayer, a catalyst layer and a carbon nanotube. The first insulation film is formed on the wiring and includes a hole which exposes the wiring. The underlayer deactivation layer is formed on the first insulation film at a side surface of the hole, and exposes the wiring at a bottom surface of the hole. The underlayer is formed on an exposed surface of the wiring at the bottom surface of the hole and on the underlayer deactivation layer at the side surface of the hole. The catalyst layer is formed on the underlayer at the bottom surface and the side surface of the hole. The carbon nanotube extends from the catalyst layer at the bottom surface of the hole, and fills the hole.

15 Claims, 4 Drawing Sheets

SEMICONDUCTOR DEVICE USING CARBON NANOTUBE, AND MANUFACTURING METHOD THEREOF

CROSS-REFERENCE TO RELATED APPLICATIONS

This application is based upon and claims the benefit of priority from Japanese Patent Application No. 2013-046523, filed Mar. 8, 2013, the entire contents of which are incorporated herein by reference.

FIELD

Embodiments described herein relate generally to a semiconductor device using a carbon nanotube, and a method of manufacturing the same.

BACKGROUND

The application of a carbon nanotube (CNT) to a via material of LSI wiring has been vigorously developed worldwide. In the via formation by the carbon nanotube, a catalyst underlayer is formed on a side surface and a bottom surface of a via hole, and a catalyst layer is formed on the catalyst underlayer. A carbon nanotube is grown from the catalyst layer and is buried in the via hole.

In this case, since the catalyst layer and catalyst underlayer are formed on the side surface of the via hole, carbon nanotubes, which do not contribute to electrical conduction, also grow from the side surface of the via hole. Since electrical conduction by the carbon nanotubes which have grown from the side surface of the via hole, is electrical conduction via a barrier metal on the side surface of the via hole, the via resistance is greatly increased. In addition, there is concern that the upper part of the via hole is filled with the carbon nanotubes which are grown from the side surface of the via hole, and the circuit is, in fact, broken.

In order to suppress growth of carbon nanotubes from the side surface of the via hole, there is known a method of forming a catalyst deactivation layer between the catalyst layer and catalyst underlayer at the side surface of the via hole. In this method, in order to grow the carbon nanotubes from the bottom surface of the via hole, it is necessary to remove, by etch-back, the catalyst deactivation layer which is formed on the bottom surface of the via hole.

However, in the via hole with a high aspect ratio, it is very difficult to surely remove the catalyst deactivation layer on the bottom surface of the via hole. In addition, when the catalyst deactivation layer is etched back, it is possible that the catalyst underlayer is damaged and the growth of the carbon nanotubes is hindered.

DETAILED DESCRIPTION

Figure 1:
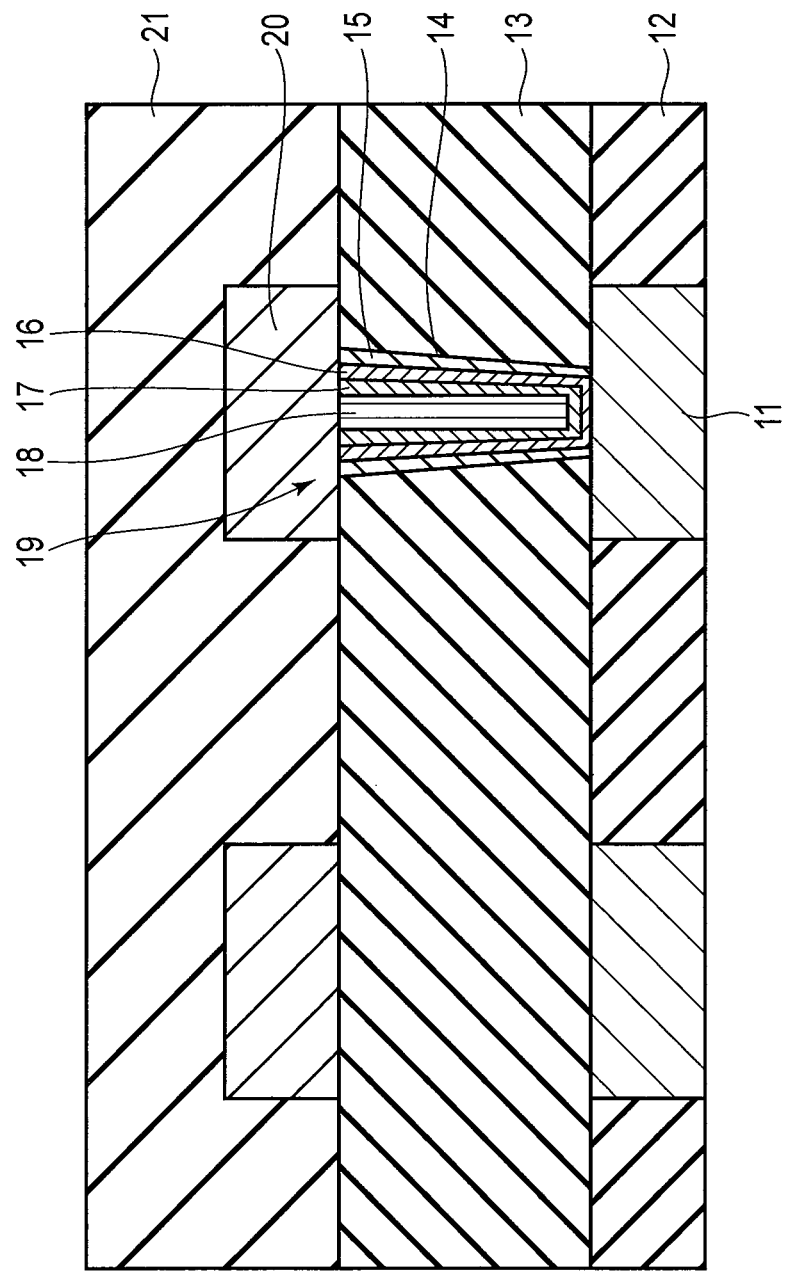
FIG. 1 is a cross-sectional view which illustrates the structure of a semiconductor device according to a first embodiment.

In general, according to one embodiment, a semiconductor device includes a wiring, a first insulation film, an underlayer deactivation layer, an underlayer, a catalyst layer and a carbon nanotube. The first insulation film is formed on the wiring and includes a hole which exposes the wiring. The underlayer deactivation layer is formed on the first insulation film at a side surface of the hole, and exposes the wiring at a bottom surface of the hole. The underlayer is formed on an exposed surface of the wiring at the bottom surface of the hole and on the underlayer deactivation layer at the side surface of the hole. The catalyst layer is formed on the underlayer at the bottom surface and the side surface of the hole. The carbon nanotube extends from the catalyst layer at the bottom surface of the hole, and fills the hole.

Embodiments will now be described with reference to the accompanying drawings. In the description, common parts are denoted by like reference numerals throughout the drawings.

[1] First Embodiment

A first embodiment relates to a technique relating to a multilayer wiring of an LSI. By forming an underlayer deactivation layer around a catalyst underlayer on a side surface of a via hole, growth of carbon nanotubes from the side surface of the via hole is suppressed.

[1-1] Structure

Referring to FIG. 1, the structure of a semiconductor device according to the first embodiment is described.

As shown in FIG. 1, a wiring 11, which is formed of, e.g. a metal, is formed in a wiring layer insulation film 12. A semiconductor substrate (not shown), on which semiconductor elements (not shown) such as transistors or capacitors are formed, is provided under the wiring layer insulation film 12. A contact (not shown) for connecting the wiring 11 and the semiconductor element is formed above the semiconductor substrate.

A via layer insulation film 13 is formed on the wiring 11 and wiring layer insulation film 12. A via hole (contact hole) 14, which exposes the surface of the wiring 11, is formed in the via layer insulation film 13. An underlayer deactivation layer 15 is formed on the via layer insulation film 13 at the side surface of the via hole 14. An underlayer 16 of a catalyst is formed on the exposed surface of the wiring 11 at the bottom surface of the via hole 14, and on the underlayer deactivation layer 15 on the side surface of the via hole 14. A catalyst layer 17 is formed on the underlayer 16 at the bottom surface and the side surface of the via hole 14. A carbon nanotube 18, which grows from the catalyst layer 17 at the bottom surface of the via hole 14, is buried in the via hole 14. In this manner, a carbon nanotube via 19 is formed in the via hole 14.

A wiring layer insulation film 21 is formed on the via layer insulation film 13. A wiring 20, which is connected to the carbon nanotube via 19, is formed in the wiring layer insulation film 21.

In this embodiment, the underlayer deactivation layer 15 is formed between the underlayer 16 and the via layer insulation film 13 at the side surface of the via hole 14, and is not formed between the underlayer 16 and wiring 11 at the bottom surface of the via hole 14. It is desirable that the underlayer deactivation layer 15 be formed on the entire side surface of the via hole 14. The underlayer deactivation layer 15 is put in direct contact with the wiring 11 at the bottom surface of the via hole 14.

Examples of the material of the underlayer deactivation layer 15 include (a) a material which alters the composition of the underlayer 16, (b) a material which alters the crystal structure of the underlayer 16, (c) a material which alters the crystal orientation or lattice constant of the underlayer 16, (d) a material with such a strong orientation property as to change the orientation of the underlayer 16, and (e) a material which alters the lattice interval of the underlayer 16. By using the underlayer deactivation layer 15 of such a material, the catalyst underlayer function of the underlayer 16 is deactivated and the growth of the carbon nanotubes 18 is hindered.

(a) The material which alters the composition of the underlayer 16 is, for example, an oxide or a nitride of a material having a higher resistance to oxidation or nitridation than an element in the underlayer 16. By using this material as the underlayer deactivation layer 15, O (oxygen) or N (nitrogen) is diffused in the material of the underlayer 16, and the underlayer 16 is oxidized or nitrided, thereby altering the composition of the material of the underlayer 16.

Examples of the material, which alters the composition of the underlayer 16, include a metal oxide (e.g. CuO, $Cu_2O$, NiO, $Co_3O_4$, CoO, or $WO_2$) of, e.g. Cu, Co, Ni, or W, which has a higher oxide forming energy than the material of the underlayer 16, and a metal nitride (e.g. $Si_3N_4$, TaN, or AlN) of, e.g. Si, Ta, or Al, which has a higher nitride forming energy than the material of the underlayer 16.

(b) The material, which alters the crystal structure of the underlayer 16, is a material which forms an intermetallic compound with a metal included in the underlayer 16. For example, in the case where the underlayer 16 includes Ta, Si is used as the underlayer deactivation layer 15, and $SiTa_2$ is formed as an intermetallic compound. In addition, in the case where the underlayer 16 includes Ti, Al is used as the underlayer deactivation layer 15, and $Al_3Ti$ is formed as an intermetallic compound. In this manner, a material, which forms an intermetallic compound with a metal included in the underlayer 16, may be used as the underlayer deactivation layer 15. Examples of the intermetallic compound include $Ni_4Mn$, $Ni_4Mo$, WIr, $WSi_2$, $SiTa_2$, and $Al_3Ti$.

(c) As the material which alters the crystal orientation or lattice constant of the underlayer 16, use may be made of a material which is close in crystal orientation or lattice constant to a material having such a crystal orientation or a lattice constant that the underlayer 16 does not function as a catalyst underlayer.

(d) The material with such a strong orientation property as to change the orientation of the underlayer 16, use may be made of a material having a strong orientation property which can change the orientation of the underlayer 16 such that the underlayer 16 may not function as a catalyst underlayer.

(e) The material, which alters the lattice interval of the underlayer 16, is a material which forms a compound with a material included in the underlayer 16. By forming a compound between the underlayer 16 and the underlayer deactivation layer 15, the lattice interval of the underlayer 16 is altered and the underlayer 16 is made inactive as a catalyst underlayer.

The underlayer 16 is formed on the wiring 11 at the bottom surface of the via hole 14, and is formed on the underlayer deactivation layer 15 at the side surface of the via hole 14. The film thickness of the underlayer 16 at the bottom surface of the via hole 14 is thicker than the film thickness of the underlayer 16 at the side surface of the via hole 14. Thereby, the growth of carbon nanotubes 18 from the bottom surface of the via hole 14 can be enhanced.

Examples of the material of the underlayer 16 include Ta, Ti, Ru, W, Al, nitrides and oxides thereof, and a multilayer material including such materials.

Examples of the material of the catalyst layer 17 include elemental metals such as Co, Ni, Fe, Ru and Cu, an alloy including at least any one of these elemental metals, and carbides of such materials. It is desirable that the catalyst layer 16 be a discontinuous film in a dispersed state. Thereby, carbon nanotubes 18 with a high density can be grown in the via hole 14. When the catalyst layer 17 is formed as a discontinuous film, it is desirable that the film thickness of the catalyst layer 17 be less than, for example, 5 nm.

Since the carbon nanotube 18 has quantized conduction (ballistic conduction), it is an ultra-low resistance material which takes the place of an existing metallic material (e.g. Cu wiring). The carbon nanotube 18 has an excellent current density resistance and is not broken under a high current density ($-1.0 \times 10^{19}$ $A/cm^2$), and thus the carbon nanotube 18 is used as a conductive material.

The carbon nanotube 18 vertically extends (grows) from the catalyst layer 17 at the bottom surface of the via hole 14, and is formed so as to fill the via hole 14. Thus, the carbon nanotube via 19, which is formed of the carbon nanotube 18, is formed such that one end thereof is put in contact with the catalyst layer 17 at the bottom surface of the via hole 14, and the other end thereof is put in contact with the wiring 20. Thereby, the carbon nanotube 19 electrically connects the wiring 11 and the wiring 20.

[1-2] Manufacturing Method

Referring to FIG. 1 to FIG. 8, a manufacturing method of the semiconductor device according to the first embodiment is described.

Figure 2:
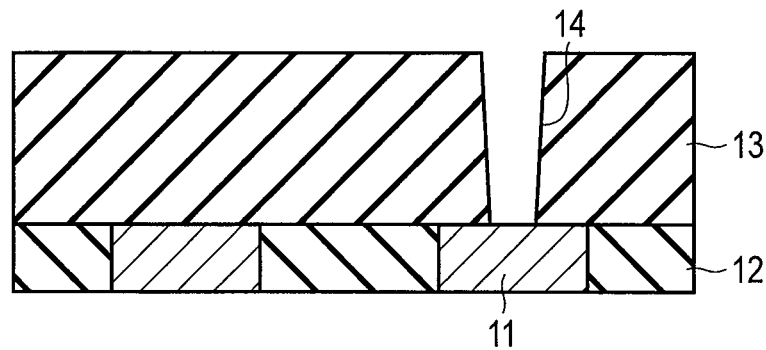
FIG. 2 is a cross-sectional view illustrating a fabrication step of the semiconductor device of the first embodiment.

To begin with, as shown in FIG. 2, a contact layer (not shown) for connecting semiconductor elements and a wiring 11 is formed on a semiconductor substrate (not shown) on which semiconductor elements (not shown), such as transistors and capacitors, are formed. The contact layer is composed of a contact layer insulation film (not shown) and a contact (not shown) formed in this contact layer insulation film. For example, a TEOS (Tetra Ethyl Ortho Silicate) film is used as the material of the contact layer insulation film, and an elemental metal, such as W, Cu, or Al, is used for the conductive material of the contact. The contact may include a barrier metal layer in order to prevent diffusion of a metal of the conductive material. Examples of the material of the barrier metal layer include Ta, Ti, Ru, Mn, Co, and nitrides thereof.

Next, a stopper layer (not shown) for process control of the wiring 11 is formed on the contact layer by, e.g. CVD (Chemical Vapor Deposition). A material (e.g. SiCN film) with a high process selectivity to the wiring layer insulation film 12 is used for this stopper layer. By the stopper layer, the depth of processing of the wiring 11 by RIE (Reactive Ion Etching) is made uniform. However, when the process selectivity between the wiring layer insulation film 12 and the contact layer insulation film is sufficiently high, this stopper layer may not be formed since the depth of processing of the wiring 11 can adequately be controlled.

Subsequently, the wiring layer insulation film 12 is formed on the stopper layer by, e.g. CVD. An SiOC film, for example, is used for the wiring layer insulation film 12. This SiOC film may be a film including pores in order to lower the dielectric constant.

Subsequently, a cap film (not shown), which serves as a protection film against RIE damage and CMP (Chemical Mechanical Polish) damage, is formed on the wiring layer insulation film 12. The cap film is, for example, an $SiO_2$ or SiOC film. The cap film may not particularly be formed in the case where the wiring layer insulation film 12 is a film (e.g. TEOS film) which is robust to RIE damage, or an SiOC film including no pore.

Next, a resist (not shown) is coated on the cap film, the resist is subjected to a lithography step, and the resist is patterned. Using the patterned resist as a mask, the wiring layer insulation film 12 is processed by RIE. Thereby, a wiring trench, which exposes the surface of the contact, is formed in the wiring layer insulation film 12. Subsequently, a barrier metal (BM) film is formed in the wiring trench and on the wiring layer insulation film 12. As the method of forming the barrier metal film, use is made of, for example, PVD (Physical Vapor Deposition), CVD, or an atomic layer vapor phase growth method. Examples of the material of the barrier metal film include Ta, Ti, Ru, Co, Mn, and nitrides and oxides of these elements.

Next, a Cu seed film (not shown), which becomes a cathode electrode of electrolysis plating, is formed on the barrier metal film by, for example, PVD, CVD, an atomic layer vapor phase growth method, etc. Subsequently, for example, by an electrolysis plating method, a Cu film, which becomes an electrically conductive material, is formed on the Cu seed film. Thereafter, an anneal process is performed on the Cu film, and the crystal structure is stabilized. Then, a CMP process is performed, and an excess Cu film is polished and removed. Thereby, a wiring 11 of a single damascene structure is formed. Then, a diffusion prevention film (or a stopper layer) (not shown), which prevents surface diffusion of Cu and becomes a process stopper layer of an upper-layer wiring structure is formed. In this manner, a lower-layer wiring structure is completed. The process up to this is the same as in a conventional Cu wiring formation method, and the method may be changed to other methods, where necessary.

Next, a via layer insulation film 13 for forming a via of an upper-layer wiring is formed on the wiring 11 and wiring layer insulation film 12. The via layer insulation film 13 is formed of, e.g. an SiOC film. The via layer insulation film 13 is formed by, e.g. CVD or a coating method. This via layer insulation film 13 may be a film including pores in order to lower the dielectric constant.

Subsequently, a cap film (not shown) is formed as a protection film against RIE damage and CMP damage of the via layer insulation film 13. The cap film is, for example, an $SiO_2$ or SiOC film. The cap film may not particularly be formed in the case where the via layer insulation film 13 is a film (e.g. TEOS film) which is robust to RIE damage, or an SiOC film including no pore.

Next, a resist (not shown) is coated on the cap film, the resist is subjected to a lithography step, and the resist is patterned. Using the patterned resist as a mask, the via layer insulation film 13 is processed by RIE. Thereby, a via hole 14, which exposes the surface of the wiring 11, is formed in the via layer insulation film 13.

Figure 3:
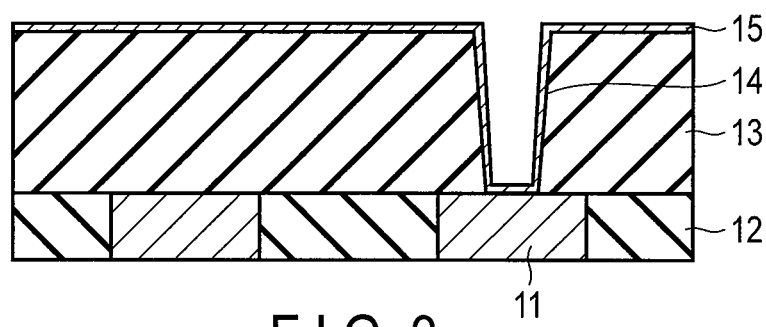
FIG. 3 is a cross-sectional view illustrating a fabrication step of the semiconductor device of the first embodiment, following the step in FIG. 2.

Following the above, as shown in FIG. 3, for example, by using CVD, an underlayer deactivation layer 15 for deactivating the catalyst underlayer is formed on the wiring 11 at the bottom surface of the via hole 14, on the via layer insulation film 13 at the side surface of the via hole 14, and on the upper surface of the via layer insulation film 13. At this time, the underlayer deactivation layer 15 is always formed on the side surface of the via hole 14.

Figure 4:
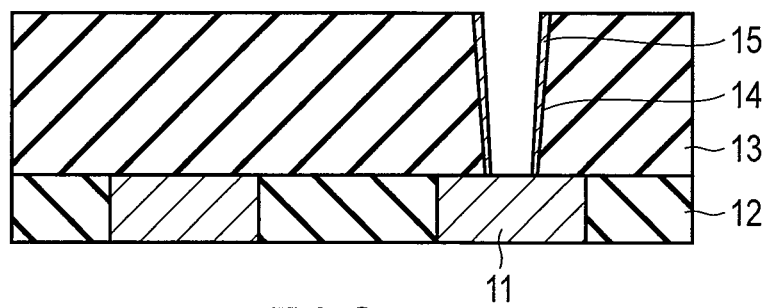
FIG. 4 is a cross-sectional view illustrating a fabrication step of the semiconductor device of the first embodiment, following the step in FIG. 3.

Next, as shown in FIG. 4, the underlayer deactivation layer 15 is etched back by, for example, RIE with a high translation property (anisotropy). Thereby, the underlayer deactivation layer 15 on the wiring 11 at the bottom surface of the via hole 14 and on the upper surface of the via layer insulation film 13 is removed, the surfaces of the wiring 11 and via layer insulation film 13 are exposed, and the underlayer deactivation layer 15 is left on only the side surface of the via hole 14. At this time, in the present embodiment, since an underlayer 16 of a catalyst is not formed under the underlayer deactivation layer 15 at the bottom surface of the via hole 14, even if the underlayer deactivation layer 15 is excessively etched back, the growth of the carbon nanotube 18 from the bottom surface of the via hole 14 is not affected.

Figure 5:
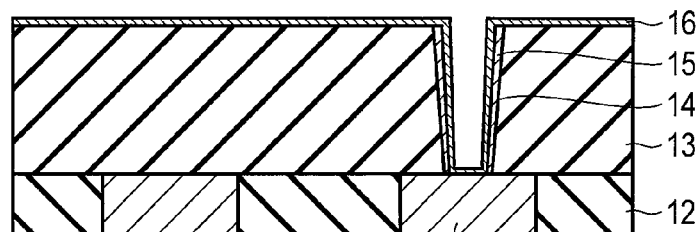
FIG. 5 is a cross-sectional view illustrating a fabrication step of the semiconductor device of the first embodiment, following the step in FIG. 4.

Subsequently, as shown in FIG. 5, by using, e.g. CVD as a film formation method with good film formation coverage, an underlayer 16 of a catalyst is formed on the exposed surface of the wiring 11 at the bottom surface of the via hole 14, on the underlayer deactivation layer 15 at the side surface of the via hole 14, and on the upper surface of the via layer insulation film 13. At this time, it is desirable that a part of the underlayer 16 at the bottom surface of the via hole 14 and a part of the underlayer 16 on the via layer insulation film 13 be formed to have a uniform film thickness. In addition, the film thickness of the underlayer formed on the upper surface of the wiring 11 at the bottom surface of the via hole 14 is thicker than the film thickness of the underlayer 16 formed on the side surface of the underlayer deactivation layer 15 at the side surface of the via hole 14.

Figure 6:
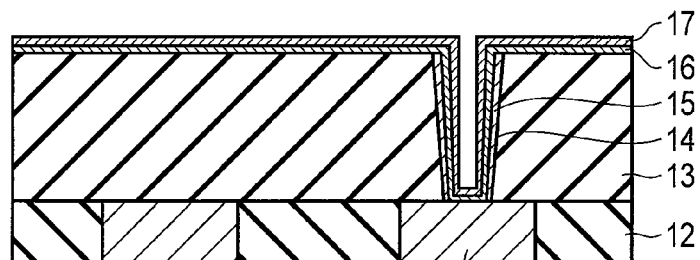
FIG. 6 is a cross-sectional view illustrating a fabrication step of the semiconductor device of the first embodiment, following the step in FIG. 5.

Next, as shown in FIG. 6, a catalyst layer 17 is formed by, e.g. CVD on the underlayer 16 at the bottom surface and side surface of the via hole 14, and on the underlayer 16 on the upper surface of the via layer insulation film 13. It is desirable that the catalyst layer 17 be a discontinuous film in a dispersed state, thereby to grow carbon nanotubes 18 with a high density.

An example of the material of the underlayer 16/catalyst layer 17 is Ti(N)/Co. In this case, Ti(N) has a function of terminating an end face of the carbon nanotube as a Ti carbide, and is necessary for a good interface contact of the carbon nanotube. The Ti(N) itself has a co-catalyst effect for promoting growth of the carbon nanotube. Co is a main catalyst of the carbon nanotube, and is necessary and indispensable for the growth of the carbon nanotube.

Figure 7:
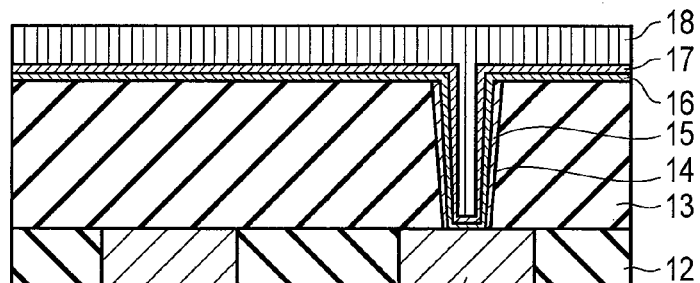
FIG. 7 is a cross-sectional view illustrating a fabrication step of the semiconductor device of the first embodiment, following the step in FIG. 6.

Next, as shown in FIG. 7, carbon nanotubes 18, which become an electrically conductive layer, are grown from the catalyst layer 17 at the bottom surfaces of the via holes 14, and from the catalyst layer 17 on the upper surface of the via layer insulation film 13. For example, CVD is used to form the carbon nanotubes 18. A hydrocarbon gas, such as methane or acetylene, or a mixture gas thereof, is used as the carbon source of the CVD, and hydrogen or inert gas is used as a carrier gas. For example, the upper limit of the process temperature is about 1000° C., the lower limit is about 200° C., and the temperature for growth should preferably be about 350° C. It is effective to use a remote plasma, and to dispose an electrode (not shown) on the substrate and apply a voltage, thereby to remove ions and electrons. In this case, the application voltage should preferably be about 0 V to ±about 100 V.

In the structure of the present embodiment, the underlayer deactivation layer 15 is formed on the side surface of the via hole 14. Thus, no growth occurs of the carbon nanotube 18 from the side surface of the via hole 14, or very slow growth occurs of the carbon nanotube 18 from the side surface of the via hole 14. Thereby, since the conductive material of the via is constituted by the carbon nanotube 18 grown from the bottom surface of the via hole 14, the number of carbon nanotubes 18, which directly contribute to conduction of electrons, becomes much greater than in the prior art, and the via resistance can be reduced.

Next, an $SiO_2$ film of SOD (Spin on Direct: coating film) is impregnated in the carbon nanotubes 18, and the carbon nanotubes 18 are fixed.

Figure 8:
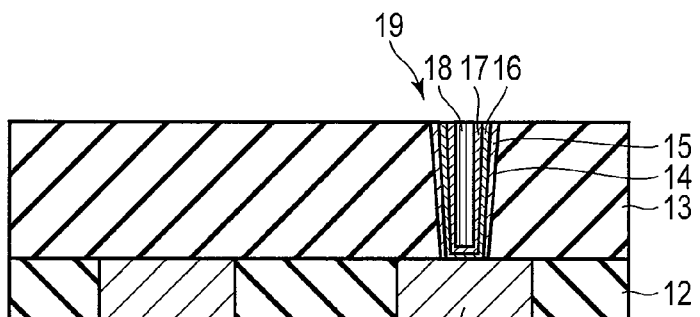
FIG. 8 is a cross-sectional view illustrating a fabrication step of the semiconductor device of the first embodiment, following the step in FIG. 7.

Subsequently, as shown in FIG. 8, the carbon nanotubes 18, catalyst layer 17 and underlayer 16, which are formed as excess portions on the upper surface of the via layer insulation film 13, are removed by, e.g. CMP. At this time, in order to reduce the dielectric constant, the cap insulation film may also be removed. In this manner, a carbon nanotube via 19 is formed in the via layer insulation film 13.

Next, as shown in FIG. 1, a stopper layer (not shown) for process control of a wiring 20 is formed on the carbon nanotube via 19 and the via layer insulation film 13, a wiring layer insulation film 21 is formed on the stopper layer, and a cap film (not shown), which becomes a damage protection film, is formed on the wiring layer insulation film 21. Subsequently, through a step of coating a resist (not shown) and lithography, a wiring trench is formed by RIE processing. Then, formation of a metal film, a thermal stabilization process and a CMP process are performed, a wiring 20 of a single damascene structure is formed, and a diffusion prevention film (not shown) is formed. In this manner, an upper-layer wiring structure is completed. The details of the formation of the upper-layer wiring structure are the same as those of the formation of the above-described lower-layer wiring structure.

In the meantime, in the above-described manufacturing method, the wirings 11 and 20 are formed by a damascene type, but they may be formed by an RIE type.

[1-3] Advantageous Effects

In the present embodiment, the underlayer deactivation layer 15, underlayer 16 and catalyst layer 17 are stacked on the side surface of the via hole 14, and the underlayer 16 and catalyst layer 17 are stacked on the bottom surface of the via hole 14. Specifically, the underlayer deactivation layer 15, which deactivates the underlayer 16, is formed on only the outer periphery of the underlayer 16 at the side surface of the via hole 14. Thereby, while only the underlayer 16 at the side surface of the via hole 14 is made inactive as a catalyst layer and the growth of the carbon nanotube 18 from the side surface of the via hole 14 is suppressed, the carbon nanotube 18 can be grown from the bottom surface of the via hole 14. Therefore, it is possible to avoid such problems that the carbon nanotubes 18 growing from the side surface of the via hole 14 increase the resistance of the via 19 and fill the upper part of the via hole 14. Furthermore, the number of carbon nanotubes 18, which grow from the bottom surface of the via hole 14 and directly contribute to electron conduction, can be made much greater than in the prior art, and the resistance of the via 19 can be reduced. Therefore, the electrical characteristics of the via 19 can be improved.

In addition, when the underlayer deactivation layer 15 on the bottom surface of the via hole 14 is to be removed by etch-back, the wiring 11 lies under the underlayer deactivation layer 15. Accordingly, even if over-etching is performed, the underlayer 16 is not damaged. Thus, the growth of the carbon nanotube 18 from the bottom surface of the via hole 14 is not hindered. In this manner, since no problem occurs even if over-etching is performed, the underlayer deactivation layer 15 on the bottom surface of the via hole 14 can surely be removed.

[2] Second Embodiment

A second embodiment relates to a structure in which a stopper layer 30 is provided around the bottom surface of the via hole 14, and the underlayer deactivation layer 15 is not formed on that part of the side surface of the via hole 14, which is near the bottom surface of the via hole 14.

[2-1]

Figure 9:
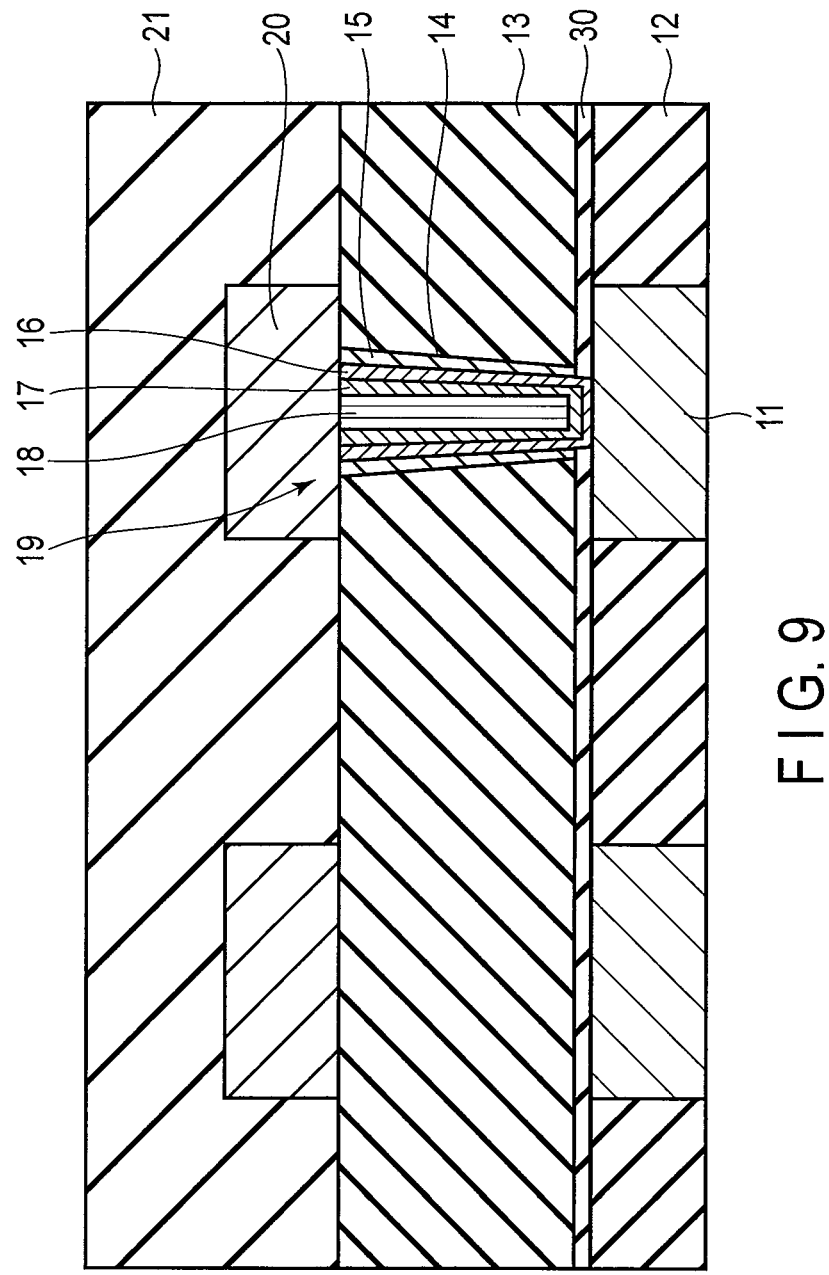
FIG. 9 is a cross-sectional view which illustrates the structure of a semiconductor device according to a second embodiment.

Referring to FIG. 9, the structure of a semiconductor device according to the second embodiment is described.

As shown in FIG. 9, the second embodiment differs from the first embodiment in that the stopper layer 30 is formed on the wiring 11 and wiring layer insulation film 12. Thus, the underlayer deactivation layer 15 is not formed around the bottom surface of the via hole 14. Since the stopper layer 30 is present between the underlayer deactivation layer 15 and the wiring 11, the underlayer deactivation layer 15 does not come in direct contact with the wiring 11.

The underlayer 16 is formed on the wiring 11 at the bottom surface of the via hole 14, is formed on the stopper layer 30 at that part of the side surface of the via hole 14, which is in the vicinity of the bottom surface of the via hole 14, and is formed on the underlayer deactivation layer 15 at the side surface of the via hole 14 excluding that part of the side surface of the via hole 14, which is in the vicinity of the bottom surface of the via hole 14.

The film thickness of the stopper layer 30 is, for example, 15 nm or more, and may be equal to the film thickness of the underlayer 16 at the bottom surface of the via hole 14. An example of the material of the stopper layer 30 is an insulative material such as SiN.

[2-2] Manufacturing Method

Referring to FIG. 9, a description is given of a manufacturing method of the semiconductor device according to the second embodiment. As regards the same fabrication steps as in the first embodiment, a description is omitted.

To begin with, like the first embodiment, a wiring 11 is formed in the wiring layer insulation film 12. Then, a stopper layer 30, which prevents surface diffusion of Cu of the wiring 11 and becomes a process stopper of an upper-layer wiring structure, is formed on the wiring 11 and wiring layer insulation film 12. A via layer insulation film 13 is formed on this stopper layer 30. The stopper layer 30 is formed of a material with a high process selectivity to the via layer insulation film 13 which is formed of, e.g. an SiOC film.

Next, a via hole 14, which exposes the surface of the stopper layer 30, is formed in the via layer insulation film 13. Then, an underlayer deactivation layer 15 is formed on the upper surface of the stopper layer 30 at the bottom surface of the via hole 14 and on the upper surface of the via layer insulation film 13 at the side surface of the via hole 14. Subsequently, the underlayer deactivation layer 15 is etched back. Thereby, the underlayer deactivation layer 15 at the bottom surface of the via hole 14 and on the upper surface of the via layer insulation film 13 is removed, and the underlayer deactivation layer 15 is left on only the side surface of the via hole 14. At this time, with the removal of the underlayer deactivation layer 15 at the bottom surface of the via hole 14, the stopper layer 30 under this underlayer deactivation layer 15 is also removed, and the wiring 11 is exposed.

Subsequently, an underlayer 16 is formed on the exposed surface of the wiring 11 at the bottom surface of the via hole 14, on the stopper layer 30 and underlayer deactivation layer 15 at the side surface of the via hole 14, and on the via layer insulation film 13, and a catalyst layer 17 is formed on the underlayer 16. Next, carbon nanotubes 18 are grown from the catalyst layer 17 at the bottom surface of the via hole 14 and from the catalyst layer 17 on the upper surface of the via layer insulation film 13. The subsequent fabrication steps are the same as in the first embodiment.

[2-3] Advantageous Effects

According to the second embodiment, the same advantageous effects as in the first embodiment can be obtained. Moreover, the following advantageous effects can be obtained.

In the second embodiment, the underlayer deactivation layer 15 is not formed on that part of the side surface of the via hole 14, which is in the vicinity of the bottom surface of the via hole 14. Thus, the deactivation of the underlayer 16 near the bottom surface of the via hole 14 is suppressed, and carbon nanotubes 18 can be more grown from the bottom surface of the via hole 14. Thereby, the electrical properties of the via 19 can be more improved.

In the meantime, in the first embodiment and the second embodiment, the underlayer deactivation layer 15 is left on only the side surface of the via hole 14, and the underlayer deactivation layer 15 at the bottom surface of the via hole 14 and on the upper surface of the via layer insulation film 13 is removed. However, it is possible to remove only the underlayer deactivation layer 15 at the bottom surface of the via hole 14, and to leave the underlayer deactivation layer 15 on the side surface of the via hole 14 and the upper surface of the via layer insulation film 13. In this case, since the underlayer 16 on the upper surface of the via layer insulation film 13 can also be deactivated, it is possible to suppress growth of carbon nanotubes 18 on the upper surface of the via layer insulation film 13. Thereby, CMP of excess carbon nanotubes 18, which are formed on the upper surface of the via layer insulation film 13, can be made easier.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device comprising:
   a wiring;
   a first insulation film formed on the wiring, the first insulation film including a hole which exposes the wiring;
   an underlayer deactivation layer which exposes the wiring at a bottom surface of the hole and is formed on the first insulation film at a side surface of the hole;
   an underlayer formed on an exposed surface of the wiring at the bottom surface of the hole and on the underlayer deactivation layer at the side surface of the hole;
   a catalyst layer formed on the underlayer at the bottom surface and the side surface of the hole; and
   a carbon nanotube which fills the hole, the carbon nanotube extending from the catalyst layer at the bottom surface of the hole.

2. The device according to claim 1, wherein a film thickness of the underlayer at the bottom surface of the hole is thicker than a film thickness of the underlayer at the side surface of the hole.

3. The device according to claim 1, further comprising a second insulation film formed between the wiring and the underlayer deactivation layer,
   wherein the underlayer is formed on the second insulation film at the side surface near the bottom surface of the hole.

4. The device according to claim 3, wherein a film thickness of the second insulation film is equal to a film thickness of the underlayer at the bottom surface of the hole.

5. The device according to claim 3, wherein the underlayer deactivation layer is not in direct contact with the wiring.

6. The device according to claim 1, wherein a material of the underlayer deactivation layer is any one of a first material which alters a composition of the underlayer, a second material which alters a crystal structure of the underlayer, a third material which alters a crystal orientation or a lattice constant of the underlayer, a fourth material with such a strong orientation property as to change an orientation of the underlayer, and a fifth material which alters a lattice interval of the underlayer.

7. The device according to claim 6, wherein the first material of the underlayer deactivation layer is a metal oxide which has a higher oxide forming energy than a material of the underlayer, or a metal nitride which has a higher nitride forming energy than the material of the underlayer.

8. The device according to claim 7, wherein the metal oxide is any one of $CuO$, $Cu_2O$, $NiO$, $Co_3O_4$, $CoO$, and $WO_2$.

9. The device according to claim 7, wherein the metal nitride is any one of $Si_3N_4$, TaN, and AlN.

10. The device according to claim 6, wherein the second material of the underlayer deactivation layer is a material which forms an intermetallic compound with a metal included in the underlayer.

11. The device according to claim 10, wherein the intermetallic compound is any one of NiMn, $Ni_4Mo$, WIr, $WSi_2$, $SiTa_2$, and $Al_3Ti$.

12. A method of manufacturing a semiconductor device, comprising:
   forming a wiring;
   forming a first insulation film on the wiring;
   forming a second insulation film on the first insulation film;
   selectively removing the second insulation film and forming a hole which exposes the first insulation film;
   forming an underlayer deactivation layer on an exposed surface of the first insulation film at a bottom surface of the hole, and on the second insulation film at a side surface of the hole;
   removing the first insulation film and the underlayer deactivation layer at the bottom surface of the hole, exposing the wiring, and leaving the underlayer deactivation layer on the second insulation film at the side surface of the hole;
   forming an underlayer on an exposed surface of the wiring at the bottom surface of the hole, on the first insulation film near the bottom surface of the hole, and on the underlayer deactivation layer at the side surface of the hole;
   forming a catalyst layer on the underlayer at the bottom surface and the side surface of the hole; and growing a carbon nanotube from the catalyst layer at the bottom surface of the hole, and filling the hole with the carbon nanotube.

13. The method according to claim 12, wherein a film thickness of the underlayer at the bottom surface of the hole is thicker than a film thickness of the underlayer at the side surface of the hole.

14. The method according to claim 12, wherein a film thickness of the first insulation film is equal to a film thickness of the underlayer at the bottom surface of the hole.

15. The method according to claim 12, wherein a material of the underlayer deactivation layer is any one of a first material which alters a composition of the underlayer, a second material which alters a crystal structure of the underlayer, a third material which alters a crystal orientation or a lattice constant of the underlayer, a fourth material with such a strong orientation property as to change an orientation of the underlayer, and a fifth material which alters a lattice interval of the underlayer.

* * * * *